(12) United States Patent
Yee et al.

(10) Patent No.: US 6,815,991 B2
(45) Date of Patent: Nov. 9, 2004

(54) CLOCK FREQUENCY MULTIPLIER

(75) Inventors: Gin S. Yee, Sunnyvale, CA (US); Shaoping Ge, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/339,214

(22) Filed: Jan. 9, 2003

(65) Prior Publication Data

US 2004/0135607 A1 Jul. 15, 2004

(51) Int. Cl.$^7$ ................................................ H03K 5/04
(52) U.S. Cl. .................. 327/172; 327/176; 327/116; 327/122
(58) Field of Search ................................ 327/113, 114, 327/115, 116, 117, 118, 119, 122, 172, 173, 176; 377/47, 48, 113

(56) References Cited

U.S. PATENT DOCUMENTS

| | | | | |
|---|---|---|---|---|
| 3,786,357 A | * | 1/1974 | Belle Isle | 327/116 |
| 4,101,789 A | * | 7/1978 | Ruhnau | 327/72 |
| 4,634,987 A | * | 1/1987 | Nolte | 327/122 |
| 4,653,079 A | * | 3/1987 | Allen | 377/47 |
| 5,587,673 A | * | 12/1996 | MacDonald | 326/93 |
| 5,864,246 A | * | 1/1999 | Anderson | 327/122 |
| 6,091,271 A | * | 7/2000 | Pant et al. | 327/122 |
| 6,377,588 B1 | * | 4/2002 | Osaki | 370/508 |
| 6,466,064 B2 | * | 10/2002 | Kurogouchi et al. | 327/113 |

* cited by examiner

Primary Examiner—Timothy P. Callahan
Assistant Examiner—An T. Luu
(74) Attorney, Agent, or Firm—Osha & May L.L.P.

(57) ABSTRACT

A clock frequency multiplier design is provided. The clock frequency multiplier includes an input stage arranged to receive an input clock signal, a first clock cycle generator stage operatively connected to the input stage and arranged to generate a low pulse on a first signal dependent on a low phase of the input clock signal, a second clock cycle generator stage operatively connected to the input stage and arranged to generate a low pulse on a second signal dependent on a high phase of the input clock signal, and an output stage operatively connected to the first clock cycle generator stage and the second clock cycle generator stage and arranged to output a high pulse on an output clock signal for every low pulse on the first signal and the second signal.

6 Claims, 4 Drawing Sheets

US 6,815,991 B2

CLOCK FREQUENCY MULTIPLIER

BACKGROUND OF THE INVENTION

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To this end, a crystal oscillator 18 generates a system clock signal sys_clk (also referred to in the art as "reference clock") to various parts of the computer system 10. However, modern microprocessors and other integrated circuits typically operate at frequencies significantly higher than that of the signals most crystal oscillators can provide, and accordingly, designers often implement various techniques to increase or multiply the frequency of the system clock signal to particular computer system components.

For example, as shown in FIG. 1, because the microprocessor 12 is able to operate at frequencies higher than that of the system clock signal sys_clk, a phase locked loop 22 is often used to output a chip clock signal chip_clk to the microprocessor 12, in which case, the chip clock signal chip_clk has a frequency that is significantly higher than that of the system clock signal sys_clk. However, in some circumstances, although frequency multiplication may be needed, implementation of a complex clock generator, such as the phase locked loop 22 shown in FIG. 1, may prove to be difficult or too costly in terms of space and design time.

To this end, integrated circuit designers have implemented various simpler frequency multiplier designs, one of which is shown in FIG. 2. In FIG. 2, an exclusive-OR gate 30 has a first input 32 operatively connected to a first clock signal clk_in and an output 34 operatively connected to a second clock signal clk_out. A delay chain 38 formed by a series inverters 40 has an input 42 operatively connected to the first clock signal clk_in and an output operatively connected to a second input 44 of the exclusive-OR gate 30.

FIG. 3 shows a timing diagram in accordance with the typical frequency multiplier design shown in FIG. 2. The timing diagram shows clock waveforms for the first clock signal clk_in (at the first input 32 of the exclusive-OR gate 30 shown in FIG. 2), the second input 44 of the exclusive-OR gate 30 shown in FIG. 2, and the second clock signal clk_out (at the output 34 of the exclusive-OR gate 30 shown in FIG. 2).

As shown in FIG. 3, the clock waveform at the second input 44 is delayed with respect to the clock waveform of the first input 32 (due to the delay of the delay chain 38 shown in FIG. 2). Because the exclusive-OR gate 30 outputs 'high' when its inputs are different, and because the clock waveforms at the first input 32 and the second input 44 are different after each rising and falling edge for a period of time less than half a clock waveform cycle at the first input 32 (and at the second input 44), the clock waveform for the output 34 of the exclusive-OR gate 30, i.e., the second clock signal clk_out, has a frequency twice that of the first clock signal clk_in.

SUMMARY OF INVENTION

According to one aspect of the present invention, an integrated circuit comprises: an input stage arranged to receive an input clock signal; a first clock cycle generator stage operatively connected to the input stage and arranged to generate a low pulse on a first signal dependent on a low phase of the input clock signal; a second clock cycle generator stage operatively connected to the input stage and arranged to generate a low pulse on a second signal dependent on a high phase of the input clock signal; and an output stage operatively connected to the first clock cycle generator stage and the second clock cycle generator stage and arranged to output a high pulse on an output clock signal for every low pulse on the first signal and the second signal.

According to another aspect, an integrated circuit comprises: means for inputting an input clock signal; first means for generating a low pulse on a first signal dependent on a low phase of the input clock signal; second means for generating a low pulse on a second signal dependent on a high phase of the input clock signal; and means for outputting a high pulse on an output clock signal for every low pulse on the first signal and the second signal.

According to another aspect, a method for multiplying a clock frequency comprises: inputting an input clock signal; generating a low pulse on a first signal dependent on a low phase of the input clock signal; generating a low pulse on a second signal dependent on a high phase of the input clock signal; and outputting a high pulse on an output clock signal for every low pulse on the first signal and the second signal.

Other aspects and advantages of the invention will be apparent from the following description and the appended claims.

DETAILED DESCRIPTION

Embodiments of the present invention relate to a method and apparatus for multiplying a clock frequency. The present invention uses a first clock cycle generator stage to generate a low phase on a first signal dependent on a high phase of an input clock signal and a second clock cycle generator stage to generate a low phase on a second signal dependent on a low phase of the input clock signal, where the first signal and the second signal are gated in order to output two clock cycles on an output clock signal for every one clock cycle of the input clock signal.

Figure 1:
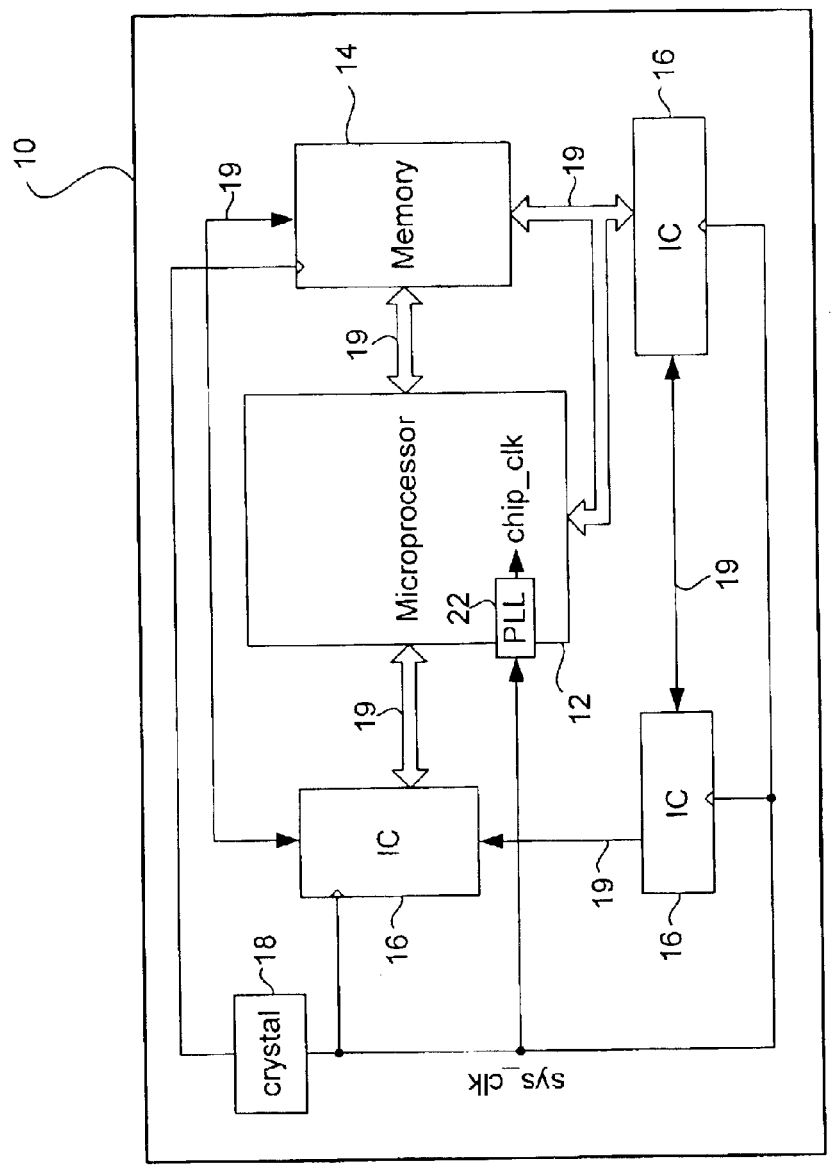
FIG. 1 shows a typical computer system.
Figure 2:
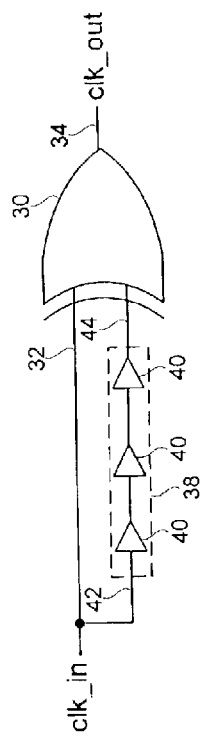
FIG. 2 shows a typical clock frequency multiplier design.
Figure 3:
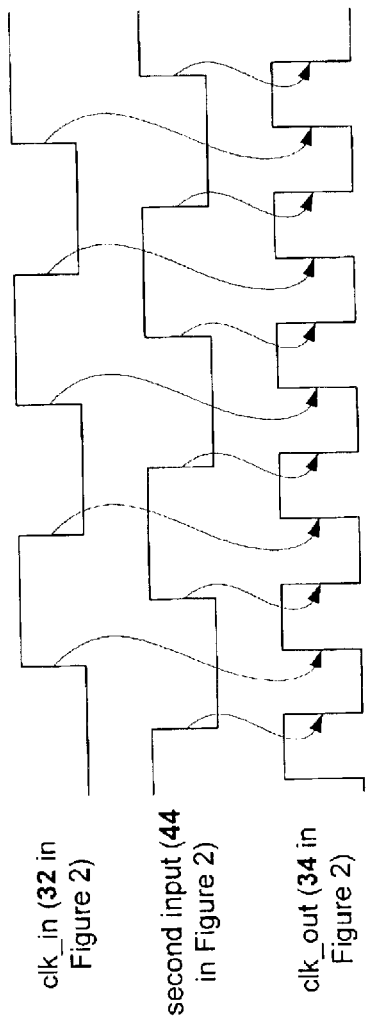
FIG. 3 shows a timing diagram in accordance with the typical clock frequency multiplier design shown in FIG. 2.
Figure 4:
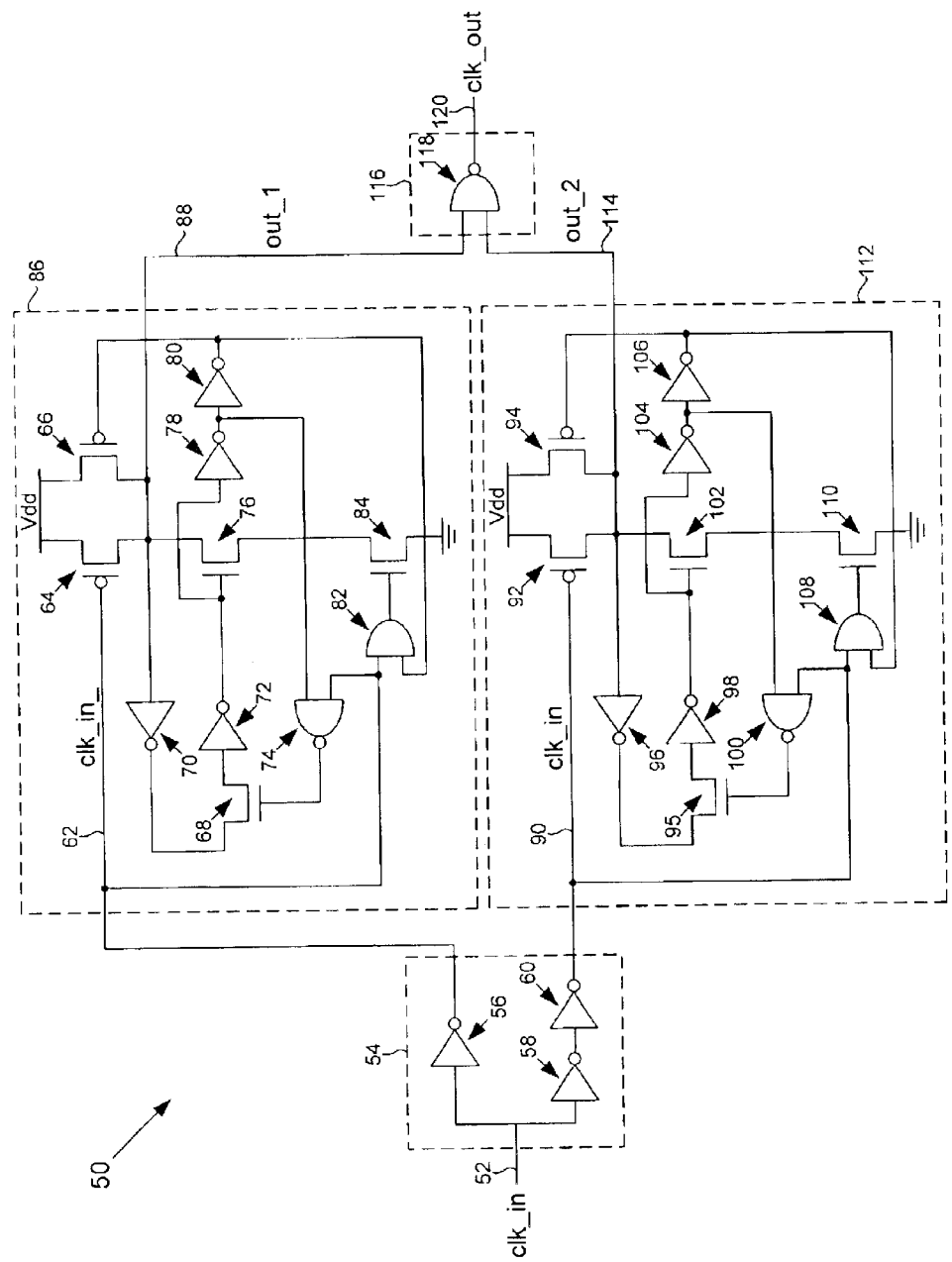
FIG. 4 shows a clock frequency multiplier design in accordance with an embodiment of the present invention.

FIG. 4 shows an exemplary clock frequency multiplier design 50 in accordance with an embodiment of the present invention. The clock frequency multiplier 50 includes an input stage 54, a first clock cycle generator stage 86, a second clock cycle generator 112, and an output stage 116.

The input stage 54 receives an input clock signal, clk_in 52, and, in turn, generates (1) a complemented version of the input clock signal, clk_in_62, using inverter 56 and (2) a non-complemented version of the input clock signal, clk_in 90, using inverters 58 and 60.

Those skilled in the art will note that the non-complemented input clock signal 90 is delayed with respect to the complemented version of the input clock signal 62 due to the fact that the non-complemented input clock signal 90 traverses two inverters 58 and 60 while the complemented input clock signal 62 traverses one inverter 56. In one or more other embodiments, the non-complemented input clock signal 90 may be generated without the inverters 58 and 60, in which case the complemented input clock signal 62 would be delayed with respect to the non-complemented input clock signal 90. Those skilled in the art will understand that inverters 56, 58, and 60 may be sized as needed in order to effectuate desired clock signal timing to the first and second clock cycle generator stages 86 and 112.

The first clock cycle generator stage 86 is arranged to receive the complemented input clock signal 62. When the complemented input clock signal 62 goes/is 'low' due to the input clock signal 52 going/being 'high,' PMOS transistor 64 switches/remains 'on,' which, in turn, causes a first signal, out_1 88, to go/remain 'high' due to a connection to Vdd through the 'on' PMOS transistor 64. Further, when the complemented input clock signal 62 goes/is 'low,' a NAND gate 74, which has an input operatively connected to the complemented input clock signal 62, outputs 'high' to an input of an NMOS transistor 68, which, in turn, causes an NMOS transistor 68 to switch/remain 'on.' An inverter 70 inputs the 'high' value on the first signal 88 and outputs 'low' through the 'on' NMOS transistor 68 to an input of an inverter 72, which, in turn, outputs 'high' to an input of an NMOS transistor 76, which, in turn, causes NMOS transistor 76 to switch/remain 'on.' Inverter 72 also outputs the 'high' to an input of an inverter 78, which, in turn, outputs 'low' to an input of NAND gate 74, thereby ensuring that NAND gate 74 outputs 'high' to the input of NMOS transistor 68. Inverter 78 also outputs the 'low' to an input of an inverter 80, which, in turn, outputs 'high' to both an input of a NAND gate 82 and an input of a PMOS transistor 66.

When the complemented input clock signal 62 goes 'high' due to the input clock signal 52 going 'low,' NAND gate 82, which then has both inputs being 'high' (one input is operatively connected to the 'high' complemented input clock signal 62 and the other input is 'high' due it being operatively connected to the output of inverter 80, which began to output 'high' when the complemented input clock signal 62 went 'low'), outputs 'high' to an input of an NMOS transistor 84, which, in turn, causes NMOS transistor 84 to switch 'on.' Because NMOS transistor 76 was switched 'on' when the complemented input clock signal 62 went 'low,' the first signal 88 goes 'low' due to its connection to ground through the 'on' NMOS transistors 76 and 84. Inverter 70 then inputs the 'low' on the first signal 88 and outputs 'high' through the 'on' NMOS transistor 68, which switched 'on' when the complemented input clock signal 62 went 'low,' to the input of inverter 72, which, in turn, outputs 'low' to the input of NMOS transistor 76, which, in turn, causes NMOS transistor 76 to switch 'off,' thereby disconnecting the first signal 88 from ground. Inverter 72 also outputs the 'low' to the input of inverter 78, which, in turn, outputs 'high' to one input of NAND gate 74 (the other input of NAND gate 74 also being 'high' due to its connection to the 'high' complemented input clock signal 62), which, in turn, outputs 'low' to the input of NMOS transistor 68, which, in turn, causes NMOS transistor 68 to switch 'off,' thereby disconnecting the output of inverter 70 from the input of inverter 72. Inverter 78 also outputs the 'high' to the input of inverter 80, which, in turn, outputs 'low' to the input of PMOS transistor 66, which, in turn, causes PMOS transistor 66 to switch 'on,' thereby pulling the first signal 88 'high' due to the connection to Vdd through the 'on' PMOS transistor 66. Thus, when the complemented input clock signal 62 goes 'high' from 'low,' the first signal 88 temporarily goes 'low' and is then pulled 'high' and remains 'high' during the period the complemented input clock signal 62 is 'low.' In other words, whenever the input clock signal 52 goes 'low,' a 'low' pulse is generated on the first signal 88.

The second clock cycle generator stage 112 is arranged to receive the non-complemented input clock signal 90. When the non-complemented input clock signal 90 goes/is 'low' due to the input clock signal 52 going/being 'low,' PMOS transistor 92 switches/remains 'on,' which, in turn, causes a second signal, out_2 114, to go/remain 'high' due to a connection to Vdd through the 'on' PMOS transistor 92. Further, when the non-complemented input clock signal 90 goes/is 'low,' a NAND gate 100, which has an input operatively connected to the non-complemented input clock signal 90, outputs 'high' to an input of an NMOS transistor 68, which, in turn, causes an NMOS transistor 95 to switch/remain 'on.' An inverter 96 inputs the 'high' value on the second signal 114 and outputs 'low' through the 'on' NMOS transistor 95 to an input of an inverter 98, which, in turn, outputs 'high' to an input of an NMOS transistor 102, which, in turn, causes NMOS transistor 102 to switch/remain 'on.' Inverter 98 also outputs the 'high' to an input of an inverter 104, which, in turn, outputs 'low' to an input of NAND gate 100, thereby ensuring that NAND gate 100 outputs 'high' to the input of NMOS transistor 95. Inverter 104 also outputs the 'low' to an input of an inverter 106, which, in turn, outputs 'high' to both an input of a NAND gate 108 and an input of a PMOS transistor 94.

When the non-complemented input clock signal 90 goes 'high' due to the input clock signal 52 going 'high,' NAND gate 108, which then has both inputs being 'high' (one input is operatively connected to the 'high' non-complemented input clock signal 90 and the other input is 'high' due to the other input being operatively connected to the output of inverter 106, which began to output 'high' when the non-complemented input clock signal 90 went 'low'), outputs 'high' to an input of an NMOS transistor 110, which, in turn, causes NMOS transistor 110 to switch 'on.' Because NMOS transistor 102 was switched 'on' when the non-complemented input clock signal 90 went 'low,' the second signal 114 goes 'low' due to its connection to ground through the 'on' NMOS transistors 102 and 110. Inverter 96 then inputs the 'low' on the second signal 114 and outputs 'high' through the 'on' NMOS transistor 95, which switched 'on' when the non-complemented input clock signal 90 went 'low,' to the input of inverter 98, which, in turn, outputs 'low' to the input of NMOS transistor 102, which, in turn, causes NMOS transistor 102 to switch 'off,' thereby disconnecting the second signal 114 from ground. Inverter 98 also outputs the 'low' to the input of inverter 104, which, in turn, outputs 'high' to one input of NAND gate 100 (the other input of NAND gate 100 also being 'high' due to its connection to the 'high' non-complemented input clock signal 90), which, in turn, outputs 'low' to the input of NMOS transistor 95, which, in turn, causes NMOS transistor 95 to switch 'off,' thereby disconnecting the output of inverter 96 from the input of inverter 98. Inverter 104 also outputs the 'high' to the input of inverter 106, which, in turn, outputs 'low' to the input of PMOS transistor 94, which, in turn, causes PMOS transistor 94 to switch 'on,' thereby pulling the second signal 114 'high' due to the connection to Vdd through the 'on' PMOS transistor 94. Thus, when the non-complemented input clock signal 90 goes 'high' from 'low,' the second signal 114 temporarily goes 'low' and is then pulled 'high' and remains 'high' during the period the non-complemented input clock signal 90 is 'low.' In other words, whenever the input clock signal 52 goes 'high,' a 'low' pulse is generated on the second signal 114.

Thus, those skilled in the art will note that due to the arrangement of the input stage 54, the first clock cycle generator stage 86, and the second clock cycle generator stage 112, a 'low' pulse is generated on the first signal 88 for every 'low' phase of the input clock signal 52 and a 'low' pulse is generated on the second signal 114 for every 'high' phase of the input clock signal 62. The output stage 116 includes a NAND gate 118 that inputs the first and second signals 88 and 114 and outputs an output clock signal, clk_out 120. Because NAND gate 118 outputs 'high' whenever one of its inputs is 'low,' and because the 'low'-going pulses on the first and second signals 88 and 114 are temporary, NAND gate 118 outputs one clock cycle on the output clock signal 120 in response to the receipt of every 'low'-going pulse on the first and second signals 88 and 114.

Figure 5:
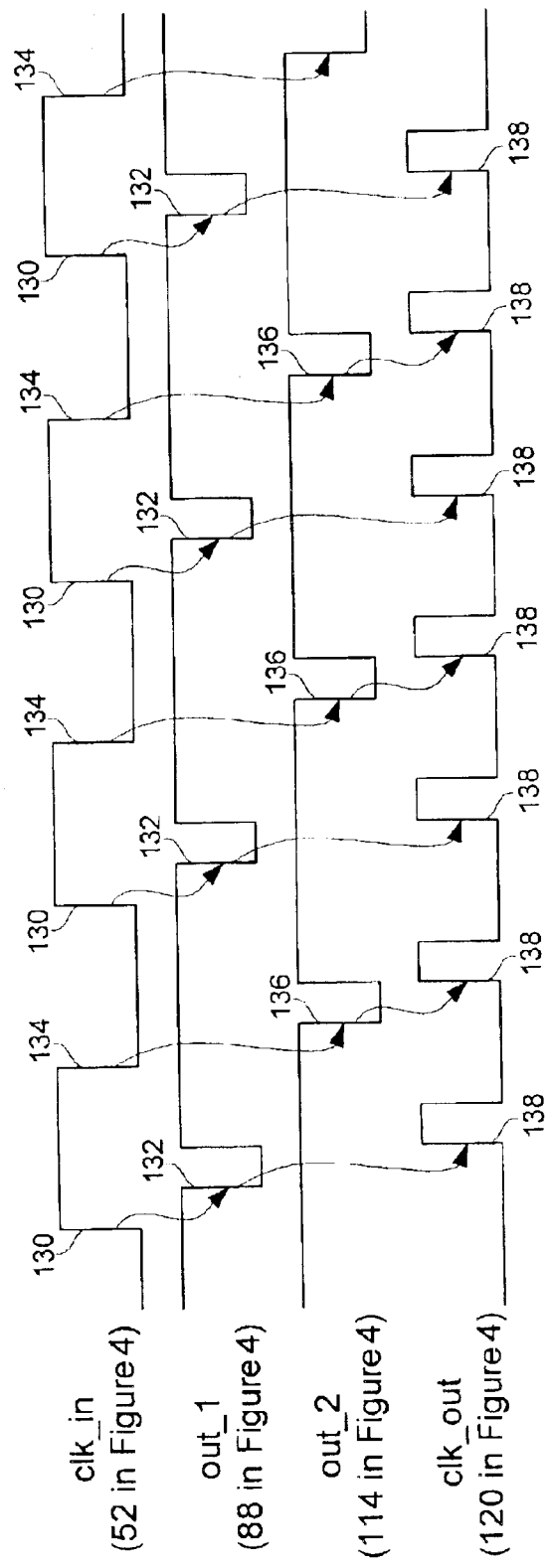
FIG. 5 shows a timing diagram in accordance with the clock frequency multiplier design shown in FIG. 4.

To exemplify the behavior of the clock frequency multiplier 50 shown in FIG. 4, FIG. 5 shows an exemplary timing diagram in accordance with the clock frequency multiplier 50 shown in FIG. 4. The timing diagram shows waveforms for the input clock signal 52, the first signal 88, the second signal 114, and the output clock signal 120.

Referring to FIG. 5, when the input clock signal 52 goes into a 'high' phase 130, a temporary 'low' pulse 132 is generated on the first signal 88 due to the operation of the circuitry of the input stage 54 and the first clock cycle generator stage 86 as described above with reference to FIG. 4. When the input clock signal 52 goes into a 'low' phase 134, a temporary 'low' pulse 136 is generated on the second signal 114 due to the operation of the circuitry of the input stage 54 and the second clock cycle generator stage 112 as described above with reference to FIG. 4. For every temporary 'low' pulse that occurs on the first and second signals 88 and 114, a temporary 'high' pulse 138 is generated on the output clock signal 120 due to the operation of the output stage 116. Accordingly, every time the input clock signal 52 goes into a 'high' phase 130 or a 'low' phase 134, a temporary 'low' pulse is generated on the first and second signals 88 and 114, respectively, which, in turn, causes the generation of a temporary 'high' pulse 138 on the output clock signal 120. Thus, as those skilled in the art will note, the output clock signal 120 has a frequency twice that of the input clock signal 52.

Advantages of the present invention may include one or more of the following. In one or more embodiments, because a simple clock frequency multiplier may be used instead of a complicated clock generator, e.g., a phase locked loop, valuable integrated circuit space and design time may be saved.

In one or more embodiments, because a clock frequency multiplier in accordance with the present invention uses redundant circuitry, valuable design time is reduced and process variations associated with different designs may be reduced.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   an input stage arranged to receive an input clock signal;
   a first clock cycle generator stage operatively connected to the input stage and arranged to generate a first type of pulse on a first signal in response to the input clock signal going to a first state, the first clock cycle generator stage comprising:
      circuitry arranged to output a voltage complementary to the first type of pulse on the first signal in response to the input clock signal being in a second state,
      circuitry arranged to generate the first type of pulse on the first signal for some amount of time in response to the input clock signal going to the first state, and
      circuitry arranged to output the voltage back onto the first signal after the some amount of time has elapsed;
   a second clock cycle generator stage operatively connected to the input stage and arranged to generate a second type of pulse on a second signal in response to the input clock signal going to the second state, wherein a duration of at least one of the first type of pulse and the second type of pulse is dependent on feedback in at least one of the first clock cycle generator stage and the second clock cycle generator stage; and
   an output stage operatively connected to the first clock cycle generator stage and the second clock cycle generator stage and arranged to output a pulse on an output clock signal in response to instances of the first type of pulse and the second type of pulse.

2. An integrated circuit, comprising:
   an input stage arranged to receive an input clock signal;
   a first clock cycle generator stage operatively connected to the input stage and arranged to generate a first type of pulse on a first signal in response to the input clock signal going to a first state;
   a second clock cycle generator stage operatively connected to the input stage and arranged to generate a second type of pulse on a second signal in response to the input clock signal going to the second state, wherein a duration of at least one of the first type of pulse and the second type of pulse is dependent on feedback in at least one of the first clock cycle generator stage and the second clock cycle generator stage, the second clock cycle generator stage comprising:
      circuitry arranged to output a voltage complementary to the second type of pulse on the second signal in response to the input clock signal being in the first state,
      circuitry arranged to generate the second type of pulse on the second signal for some amount of time in response to the input clock signal going to the second state, and
      circuitry arranged to output the voltage back onto the second signal after the some amount of time has elapsed; and
   an output stage operatively connected to the first clock cycle generator stage and the second clock cycle generator stage and arranged to output a pulse on an output clock signal in response to instances of the first type of pulse and the second type of pulse.

3. An integrated circuit, comprising:
   means for inputting an input clock signal;
   first means for generating a first type of pulse on a first signal in response to the input clock signal going to a first state, the first means for generating comprising:
      means for outputting a voltage complementary to the first type of pulse on the first signal in response to the input clock signal being in a second state, means for generating the first type of pulse on the first signal for some amount of time in response to the input clock signal going to the first state, and means for outputting the voltage back onto the first signal after the some amount of time has elapsed;

second means for generating a second type of pulse on a second signal in response to the input clock signal going to a second state, wherein a duration of at least one of the first type of pulse and the second type of pulse is dependent on feedback in at least one of the first means and the second means; and means for outputting a pulse on an output clock signal in response to instances of the first type of pulse and the second type of pulse.

4. An integrated circuit, comprising:

means for inputting an input clock signal;

first means for generating a first type of pulse on a first signal in response to the input clock signal going to a first state;

second means for generating a second type of pulse on a second signal in response to the input clock signal going to a second state, wherein a duration of at least one of the first type of pulse and the second type of pulse is dependent on feedback in at least one of the first means and the second means, the second means for generating comprising:

means for outputting a voltage complementary to the second type of pulse on the second signal in response to the input clock signal being in the first state, means for generating the second type of pulse on the second signal for some amount of time in response to the input clock signal going to the second state, and means for outputting the voltage back onto the second signal after the some amount of time has elapsed; and means for outputting a pulse on an output clock signal in response to instances of the first type of pulse and the second type of pulse.

5. A method for multiplying a clock frequency, comprising:

inputting an input clock signal;

generating a first type of pulse on a first signal in response to the input clock signal going to a first state, the generating the first type of pulse on the first signal comprising:

outputting a voltage complementary to the first type of pulse on the first signal in response to the input clock signal being in a second state, generating the first type of pulse on the first signal for some amount of time in response to the input clock signal going to the first state, and outputting the voltage back onto the first signal after the some amount of time has elapsed;

generating a second type of pulse on a second signal in response to the input clock signal going to a second state, wherein a duration of at least one of the first type of pulse and the second type of pulse is dependent on feedback from at least one of the first signal and the second signal; and outputting a pulse on the output clock signal in response to instances of the first type of pulse and the second type of pulse.

6. A method for multiplying a clock frequency, comprising:

inputting an input clock signal;

generating a first type of pulse on a first signal in response to the input clock signal going to a first state;

generating a second type of pulse on a second signal in response to the input clock signal going to a second state, wherein a duration of at least one of the first type of pulse and the second type of pulse is dependent on feedback from at least one of the first signal and the second signal, the generating the second type of pulse on the second signal comprising:

outputting a voltage complementary to the second type of pulse on the second signal in response to the input clock signal being in the first state, generating the second type of pulse on the second signal for some amount of time in response to the input clock signal going to the second state, and outputting the voltage back onto the second signal after the some amount of time has elapsed; and outputting a pulse on the output clock signal in response to instances of the first type of pulse and the second type of pulse.

* * * * *